US006969880B2

(12) United States Patent
Burke et al.

(10) Patent No.: US 6,969,880 B2
(45) Date of Patent: Nov. 29, 2005

(54) HIGH CAPACITIVE DENSITY STACKED DECOUPLING CAPACITOR STRUCTURE

(75) Inventors: Edmund Burke, Dallas, TX (US); Benjamin P. McKee, Richardson, TX (US); Frank S. Johnson, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 123 days.

(21) Appl. No.: 10/670,037

(22) Filed: Sep. 24, 2003

(65) Prior Publication Data

US 2005/0064673 A1 Mar. 24, 2005

(51) Int. Cl.[7] .................. H01L 27/108; H01L 21/20
(52) U.S. Cl. ............... 257/296; 257/300; 257/310; 257/532; 438/393; 438/250; 438/239
(58) Field of Search ............... 438/393, 396, 438/381, 250, 240, 239, 238; 257/296, 300, 257/310, 532

(56) References Cited

U.S. PATENT DOCUMENTS 5,851,868 A * 12/1998 Kim ..................... 438/238

5,998,264 A * 12/1999 Wu ...................... 438/260

OTHER PUBLICATIONS

U.S. Appl. No. 10/335,333, filed Dec. 31, 2002, S.S. Papa Rao et al.*
U.S. Appl. No. 10/638,596, filed Aug. 11, 2003, S.S. Papa Rao et al.*

* cited by examiner

Primary Examiner—Michael Trinh
(74) Attorney, Agent, or Firm—Peter K. McLarty; W. James Brady, III; Frederick J. Telecky, Jr.

(57) ABSTRACT

A capacitive structure (10). The capacitive structure comprises a semiconductor base region (30) having an upper surface, a well (12) formed within the semiconductor base region and adjacent the upper surface, a first dielectric layer (38) adjacent at least a portion of the upper surface, and a polysilicon layer (16) adjacent the first dielectric layer. The well, the first dielectric layer, and the first polysilicon layer form a first capacitor and are aligned along a planar dimension. The capacitive structure further comprises a first conductive layer ($20_1$) positioned with at least a portion overlying at least a portion of the polysilicon layer, a second dielectric layer ($20_2$) adjacent the first conductive layer, and a second conductive layer ($20_3$) adjacent the second dielectric layer. The first conductive layer, the second dielectric layer, and the second conductive layer form a second capacitor and are aligned along the planar dimension.

19 Claims, 2 Drawing Sheets

HIGH CAPACITIVE DENSITY STACKED DECOUPLING CAPACITOR STRUCTURE

CROSS-REFERENCES TO RELATED APPLICATIONS

This application is related to U.S. patent application Ser. No. 10/669,847 (TI-35258), filed concurrently herewith, and entitled "Dual Mask Capacitor For Integrated Circuits (TI-35258)."

STATEMENT REGARDING FEDERALLY SPONSORED RESEARCH OR DEVELOPMENT

Not Applicable.

BACKGROUND OF THE INVENTION

The present embodiments relate to semiconductor devices and methods and are more particularly directed to a stacked decoupling capacitor structure.

Semiconductor devices are prevalent in countless different aspects of contemporary society, and as a result, the marketplace for such devices continues to advance at a fairly rapid pace. This advancement is evident in many respects and relates to semiconductor devices either directly or indirectly as well as the methods for forming such devices. For example, the advancement affects numerous device attributes and increases the need for attention to such attributes during design and manufacturing, where such attributes include device size, reliability, yield, and cost. These aspects as well as others are addressed by the prior art and are further improved upon by the preferred embodiments as detailed below.

By way of further background, the preferred embodiments relate to decoupling capacitors formed integrally with an integrated circuit. Decoupling capacitors are used to "decouple" or isolate a signal on a conductor. A common example is connecting a decoupling capacitor between a supply voltage and ground such that any transient or other noise signal affecting the power supply is suppressed by the capacitor, thereby decoupling that signal from other components in the device. While formerly decoupling capacitors were sometimes implemented using separate discrete devices, with the continued advancement of integrated circuits a polysilicon to N-well decoupling capacitor also has been developed. As a capacitor in general, this device includes two conductive plates separated by a dielectric. More specifically and as suggested by its name as a polysilicon to N-well decoupling capacitor, one layer of doped polysilicon forms one of the capacitor's conductive plates while an N-well, formed within either another well or within a semiconductor substrate, forms the other conductive plate. Lastly, these two plates are separated by a dielectric, which is typically silicon dioxide formed at the same time and from the same material that is also used to form the gate dielectric for various transistors being formed with respect to the same well or substrate.

While polysilicon to N-well decoupling capacitors have been used successfully in various devices, various drawbacks have been observed in such devices as performance demands increase. Particularly, with increased performance demands, there is a corresponding increase in the need for total decoupling capacitance. Further, the location of decoupling capacitors may be distributed in numerous locations across an integrated circuit die. Thus, when using polysilicon to N-well decoupling capacitors in an attempt to satisfy demands, there is a trade-off in that larger amounts of chip area are required to implement the capacitors, where it is well-known that such area can be quite costly in terms of design and, indeed, in some instances, prohibitive. As another consideration, recall that present polysilicon to N-well decoupling capacitors use the transistor gate dielectric layer as a dielectric between the capacitor plates. However, there also is a trend in the transistor art to decease the thickness of these gate dielectrics, which correspondingly decreases the amount of capacitive material in the polysilicon to N-well decoupling capacitors. Such a result is undesirable for the capacitor for two reasons. First, it increases the chance of capacitor leakage because the likelihood of leakage increases as dielectric thickness decreases and the need for decoupling increases. Second, with a thinner capacitive dielectric, there is a greater chance of an electrical short-circuit through the dielectric and, hence, between the capacitor plates. The N-well in such a case may provide some resistance to the current flowing through the short-circuit so as to prevent a total device failure, yet the decoupling effect is lost and, hence, with a sufficient number of such failures then device yield is reduced and/or circuit performance is reduced.

In view of the above, the present inventors provide below alternative embodiments for improving upon various drawbacks of the prior art.

BRIEF SUMMARY OF THE INVENTION

In one preferred embodiment, there is a capacitive structure. The capacitive structure comprises a semiconductor base region having an upper surface, a well formed within the semiconductor base region and adjacent the upper surface, a first dielectric layer adjacent at least a portion of the upper surface, and a polysilicon layer adjacent the first dielectric layer. The well, the first dielectric layer, and the first polysilicon layer form a first capacitor and are aligned along a planar dimension. The capacitive structure further comprises a first conductive layer positioned with at least a portion overlying at least a portion of the polysilicon layer, a second dielectric layer adjacent the first conductive layer, and a second conductive layer adjacent the second dielectric layer. The first conductive layer, the second dielectric layer, and the second conductive layer form a second capacitor and are aligned along the planar dimension.

Other aspects are also disclosed and claimed.

DETAILED DESCRIPTION OF THE INVENTION

Figure 1:
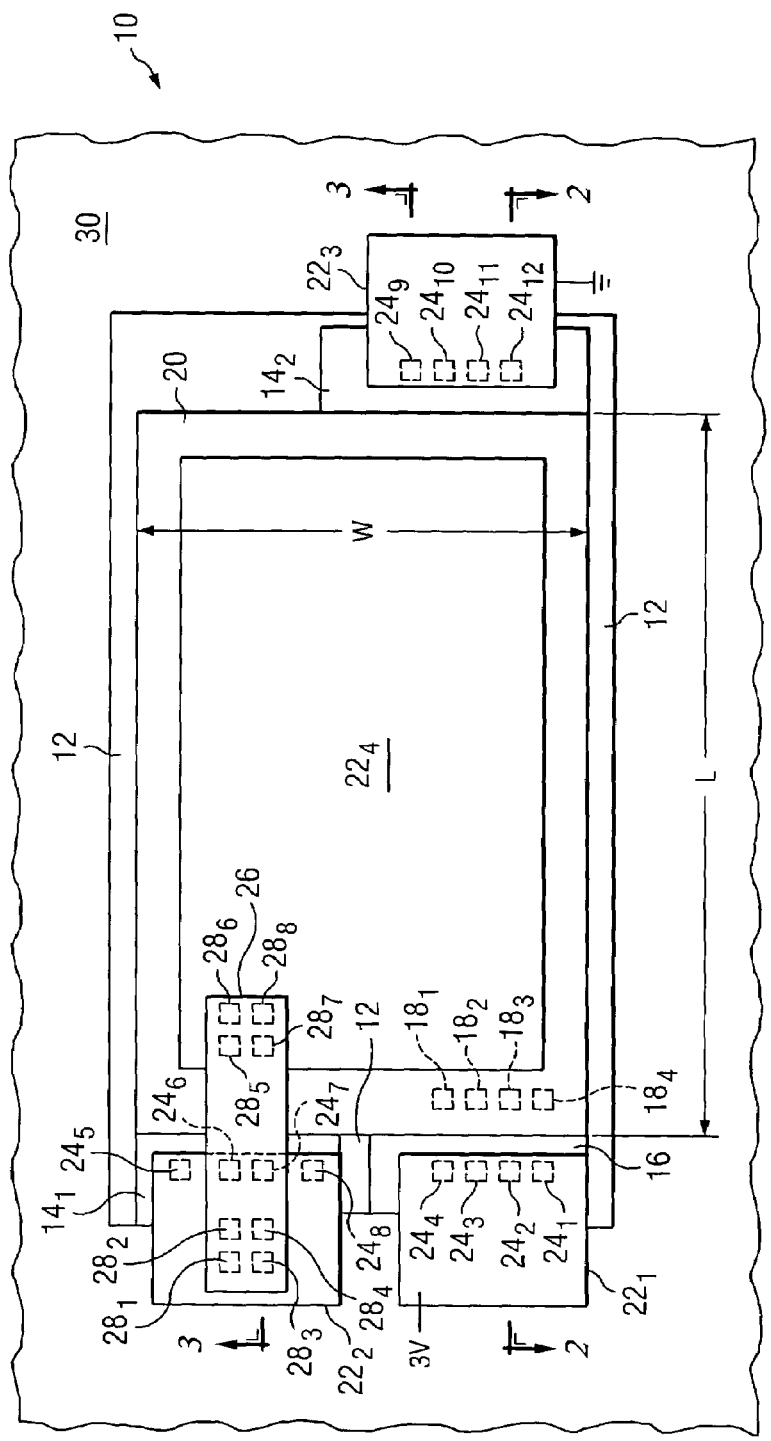
FIG. 1 illustrates a top view of a stacked decoupling capacitor structure according to the preferred embodiments.
Figure 2:
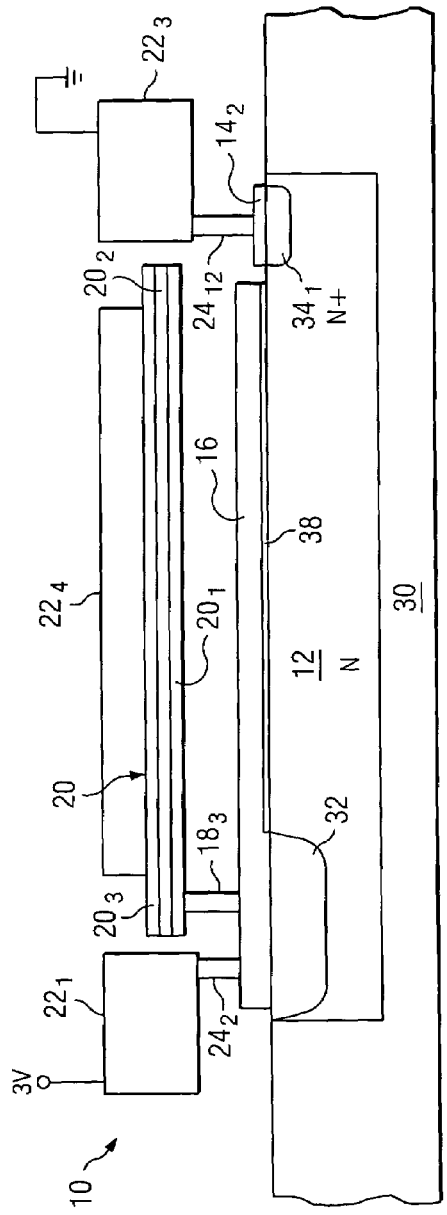
FIG. 2 illustrates a first cross-sectional view of the stacked decoupling capacitor structure of FIG. 1.
Figure 3:
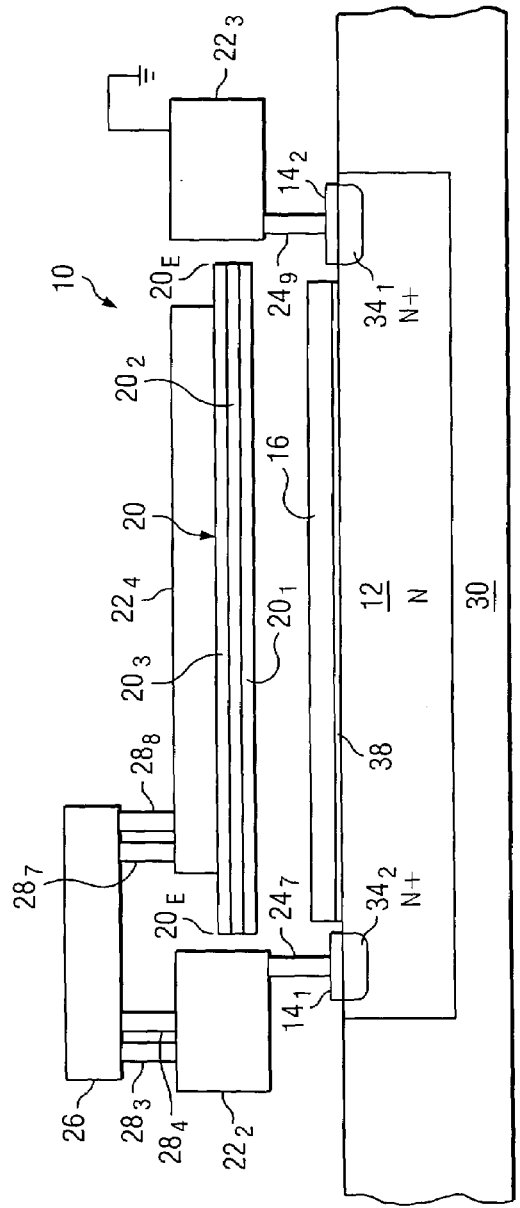
FIG. 3 illustrates a second cross-sectional view of the stacked decoupling capacitor structure of FIG. 1.

FIG. 1 illustrates a top view of a decoupling capacitor structure 10 according to the preferred embodiment and built within a semiconductor integrated circuit. Structure 10, as explored further below in connection with FIGS. 2 and 3, is constructed using numerous layers from which various components are formed. Proceeding generally from a bottom-to-top approach in FIG. 1, structure 10 includes a well 12, preferably of an N-type material. Toward the top left and bottom right of structure 10 are two silicide regions $14_1$ and $14_2$ where active doped regions are underneath regions $14_1$ and $14_2$, but those active regions are not visible from the perspective of FIG. 1. In any event, electrical contact to either of silicide regions $14_1$ and $14_2$ provides contact, via the respective underlying active doped regions, to well 12. A doped polysilicon region 16 is visible toward the left of FIG. 1, and for reasons discussed later will be shown to extend a considerable distance in what is shown as the horizontal dimension in FIG. 1, although the span of that extension is not visible from the perspective of FIG. 1. Four contacts $18_1$, $18_2$, $18_3$, and $18_4$, are shown using dotted squares in FIG. 1. The dotted convention is used with contacts $18_1$, $18_2$, $18_3$, and $18_4$ because such contacts are not actually viewable from the perspective of FIG. 1 because they are below the bottom layer of a metal-interlevel oxide-metal ("MIM") capacitor 20, where only a portion of the top layer of MIM capacitor 20 is visible in FIG. 1. Structure 10 also includes four metal-1 regions $22_1$, $22_2$, $22_3$, and $22_4$, where contacts extend below the first three of those four regions. Metal-1 region $22_1$ includes four contacts $24_1$, $24_2$, $24_3$, and $24_4$, metal-1 region $22_2$ includes four contacts $24_5$, $24_6$, $24_7$, and $24_8$, and metal-1 region $22_3$ includes four contacts $24_9$, $24_{10}$, $24_{11}$, and $24_{12}$. Lastly, structure 10 includes a metal-2 region 26, where eight contacts extend below that region. Specifically, these contacts include contacts $28_1$, $28_2$, $28_3$, $28_4$, $28_5$, $28_6$, $28_7$, and $28_8$.

FIG. 2 illustrates a cross-sectional view of structure 10 along line 2—2 in FIG. 1. Thus, FIG. 2 illustrates various of the components discussed above with respect to FIG. 1, as well as additional aspects and components that are appreciated from a cross-sectional perspective. Well 12 is formed in a fixed position relative to some type of semiconductor region, where that region is shown as a region 30 in FIG. 2. Such a region could be, by ways of example, another well or a semiconductor substrate and, thus, for sake of reference is hereafter identified as substrate 30. Thus, the remaining illustrated devices also are formed in a fixed position relative to substrate 30. Note also with respect to FIG. 2, as well as in FIG. 3 described below, that a few simplifications are made as will be appreciated by one skilled in the art so as to not unduly complicate the figures, while still presenting an understanding of the preferred embodiments. First, the figures are not drawn to scale. Second, certain intermediate dielectric or insulating layers are not shown but will be understood to be included so as to provide adequate isolation as well as physical support for the various structures as they are formed in a stacked fashion to create the overall structure 10.

Returning to well 12, within it is an isolation region 32, sometimes referred to as a shallow trench isolation ("STI") region, which is an insulating material such as an oxide. Also within well 12 is an active region $34_1$, and since the present example for well 12 is as an N-type material, then preferably active region $34_1$ is an N+ region, that is, it has a higher concentration of N-type dopants as compared to well 12. Overlying active region $34_1$ is silicide region $14_2$, formed by applying and reacting a metal and thereby facilitating a lower sheet-resistance electrical contact to active region $34_1$. Overlying a portion of the upper surface of well 12 is a gate insulator 38, formed of an insulating substance such as silicon dioxide. The term "gate" is used in connection with this insulator because, in the preferred embodiment, gate insulator 38 is formed at the same time as are other gate insulators for transistors (not expressly shown) that are formed in the same step as the formation of gate insulator 38. In other words, in the preferred embodiment, it is contemplated that structure 10 is formed as part of an integrated circuit that will include a number of transistors, although such transistors are not shown so as to simplify the figures and to focus on the inventive capacitive structure. At the same time as certain steps are used to create those transistors, the same processing steps can be used to form various aspects of structure 10. For example, such structures include the already-described well 12, isolation region 32, active region $34_1$, silicide region $14_2$, and gate insulator 38. Indeed, one skilled in the art will appreciate that many of the later-described-regions also may be formed at the same time and using the same steps as are known and used in the art to form integrated circuit transistors and their interconnects. In any event, therefore, when the gate insulators are formed for such transistors, at the same time gate insulator 38 is formed.

Continuing with structure 10 as shown in FIG. 2, overlying gate insulator 38 and isolation region 32 is doped polysilicon region 16. Recall in FIG. 1 that only a portion of doped polysilicon region 16 is visible toward the left of that Figure. However, in FIG. 2, it may be seen that doped polysilicon region 16 in the preferred embodiment extends a majority of the horizontal distance across structure 10. The function of this extension is now better understood in that the combination of doped polysilicon region 16, gate insulator 38, and well 12 form a first capacitor in structure 12. More particularly, doped polysilicon region 16 serves as a first capacitor plate, well 12 serves a second capacitor plate, and gate insulator 38 between them serves as a capacitor dielectric. Thus, it may be seen that each of these three layers generally extends in a parallel planar dimension and that plane is also parallel to a plane through substrate 30. Given this first capacitor, the greater the area covered by doped polysilicon region 16 and the corresponding dielectric covered by gate insulator 38, the larger the device capacitance. Such an increase is highly desirable for a decoupling capacitor, as is the purpose served by structure 10.

Continuing still further with structure 10 as shown in FIG. 2, contact $18_3$ is shown between doped polysilicon region 16 and MIM capacitor 20, where MIM capacitor 20 provides a second capacitor in structure 10. Specifically, from the perspective of FIG. 2, it may be seen that MIM capacitor 20 includes three layers $20_1$, $20_2$, and $20_3$, and each of these layers also is generally along and parallel to the same planar dimension along which substrate 30 and the above-described capacitor, formed by polysilicon layer 16, gate insulator 38, and well 12, are aligned. Further, contact $18_3$ contacts the lower of those layers, namely, layer $20_1$, where therefore contact $18_3$ is substantially perpendicular to the plane spanned by the two above-discussed capacitors. Layers $20_1$ and $20_3$ are conductive plates, while layer $20_2$ is a dielectric, all of which are detailed later. At this point, however, note then that an electrical bias, as applied to doped polysilicon region 16, is communicated by contact $18_3$ to layer $20_1$, that is, the electrical bias is connected to one plate of the second capacitor provided by MIM capacitor 20. Overlying layer $20_3$ of MIM capacitor 20, that is, the upper layer of that capacitor, is metal-1 region $22_4$. At the same time metal-1 region $22_4$ is formed, so are metal-1 regions $22_1$ and $22_3$. Metal-1 region $22_1$ is electrically connected by contact $24_2$ to doped polysilicon region 16. Note two additional observations with respect to this connection. First, preferably any contact to doped polysilicon region 16 is preferably made over an isolation region, and it is for this reason that isolation region 32 was formed in well 12, that is, due to the subsequent need to contact doped polysilicon region 16 with contacts $18_3$ and $24_2$. Second, given the illustration as has now been described, note further by way of example that a voltage of 3 volts is shown connected to metal-1 region $22_1$. Thus, the 3 volts connected to metal-1 region $22_1$ is electrically communicated by contact $24_2$ to doped polysilicon region 16, and from doped polysilicon region 16 that 3 volts is electrically communicated by contact $18_3$ to layer $20_1$, that is, to the to the bottom plate of MIM capacitor 20. Lastly, metal-1 region $22_3$ is electrically connected by contact $24_{12}$ to silicide region $14_2$ which, as described earlier, is electrically connected to active region $34_1$. Finally, for reasons detailed below, note that FIG. 2 illustrates that metal-1 region $22_3$ is connected to ground. Thus, this ground potential is electrically communicated by contact $24_{12}$, silicide region $14_2$, and active region $34_1$, to the N-type well 12.

FIG. 3 illustrates a cross-sectional view of structure 10 along line 3—3 in FIG. 1 and, again, therefore, it illustrates various of the components discussed above with respect to FIG. 1. FIG. 3 also illustrates additional aspects and components that are appreciated from a cross-sectional perspective and that are not shown in the cross-sectional perspective of FIG. 2. However, to the right of FIG. 3, it illustrates generally the same components shown in FIG. 2 and, thus, the reader is either assumed familiar with the earlier discussion or is referred to that discussion for additional detail. Accordingly, the following discussion focuses on the items shown in FIG. 3 that are not shown in FIG. 2.

Looking to the left of FIG. 3 and starting at the top of metal-1 region $22_4$, it is electrically connected by two contacts $28_7$ and $28_8$ to metal-2 region 26. Further, metal-2 region 26 is electrically connected to metal-1 region $22_2$ by two contacts $28_3$ and $28_4$. Still further, metal-1 region $22_2$ is electrically connected to silicide region $14_1$ by a contact $24_7$, and silicide region $14_1$ overlies an active region $34_2$, which in the preferred embodiment is formed at the same time as active region $34_1$ of FIGS. 2 and 3 and, thus, which is an N+ region having a higher concentration of N-type dopants as compared to well 12. Having described these various connections to the left of FIG. 3 and for introducing an aspect described later, note now the overall electrical path created by them. Specifically, recall that layer $20_3$ represents a top capacitor plate for MIM capacitor 20. Further, layer $20_3$ is in physical and electrical contact with metal-1 region $22_4$, which through contacts $28_7$ and $28_8$, is in electrical contact with metal-2 region 26, which though contacts $28_3$ and $28_4$, is in electrical contact with metal-1 region $22_2$, which though contact $24_7$, silicide region $14_1$, and active region $34_2$, is in electrical contact with N-type well 12.

Having described structure 10 from various perspectives, attention is now directed to a preferred manner in which it may be constructed. By way of introduction, recall earlier in connection with gate insulator 38 that the discussion states that various of the components of structure 10 are preferably formed using the same steps that are used to form transistors, also associated with substrate 30. As such and as now further appreciated, structure 10 can be implemented with very little alteration to an existing transistor process flow, thereby improving overall device cost. Generally, therefore, up to the formation of MIM capacitor 20, all devices shown below the horizontal plane of MIM capacitor 20 in FIGS. 2 and 3 are constructed according to principles used for the formation of prior art transistors. For example, active regions $34_1$ and $34_2$ are formed at the same time as are the source/drain implants for any nearby transistor(s) and those areas are silicided at the same time as the transistor source/drains, gate insulator 38 is formed at the same time as is the gate insulator for any nearby transistor(s), and doped polysilicon region 16 is formed at the same time as is the gate for any nearby transistor(s). Thereafter, an insulating layer (not shown) is formed, patterned and etched to form holes through that layer, and those holes are filled with a conductive material, such as tungsten, to form contacts $24_7$ and $24_{12}$.

In the preferred embodiment, after contacts $24_7$ and $24_{12}$ are formed, MIM capacitor 20 is formed, where its formation entails steps not necessarily provided by the construction of transistors or the interconnectivity of those transistors. In the preferred embodiment, MIM capacitor 20 is formed by first forming a first conductive layer, which in the preferred embodiment is achieved by depositing a conductive layer, such as tantalum nitride (TaN) in the preferred embodiment. Next, a dielectric layer is deposited over the first conductive layer, such as $Ta_2O_5$ in the preferred embodiment. Note that $Ta_2O_5$ has heretofore been used in the dynamic random access memory ("DRAM") art and therefore in the preferred embodiment the process used in that art may be employed here, albeit to create an inventive overall structure 10. Further, in alternative preferred embodiments, a material other than $Ta_2O_5$ may be used for the dielectric layer, where preferably such a material has a sufficiently high dielectric constant so as to provide a greater decoupling effect, where a desirable dielectric constant may be greater than 4.0. Next, a second conductive layer is deposited over the dielectric layer, again such as TaN in the preferred embodiment. At this point, the three layers are patterned and etched at the same time, thereby forming a same dimension uniform stack, providing MIM capacitor 20.

Following the formation of MIM capacitor 20, again the remaining portions of structure 10 can be implemented according to principles used for the formation of prior art transistors and the interconnectivity between them, thus requiring no alteration to existing process flow other than, of course, having formed MIM capacitor 20 prior to the formation of metal-1 as described above. For example with respect to the remaining process, following the formation of MIM capacitor 20, an intermetal dielectric can be formed (not shown) and thereafter all metal-1 regions can be formed, that is, the first level of metal proximate substrate 30 is formed so as to provide local and possibly global interconnects. This step will include the formation of metal-1 regions $22_1$ through $22_4$. In the preferred embodiment, however, note that metal-1 region $22_4$ preferably has surface dimensions that are less than those of MIM capacitor 20. In other words, looking to FIG. 1, it may be seen that MIM capacitor 20 has a surface length, L, in a first dimension (shown horizontally) and a surface width, W, in a perpendicular dimension (shown vertically). When metal-1 region $22_4$ is formed, its corresponding length and width are preferably less than L and W, respectively. Returning to FIG. 2, the reason for this preference is to prevent metal-1 region $22_4$ from extending beyond an edge $20_E$ of MIM capacitor 20, for if such an extension were to occur, it may short-circuit layers $20_1$ and $20_3$ together, thereby bypassing the capacitive effect provided by MIM capacitor 20. In any event, once the metal-1 layer is complete, the remaining layers and connections, that are still farther from substrate 30 than the metal-1 layer regions, also may be achieved as known in the transistor art. For example, a dual damascene process may be used for the formation of a metal-2 layer, thereby forming metal-2 region 26 and contacts $28_1$ through $28_8$ at the same time and from the same material, such as copper, or alternatively, contacts $28_1$ through $28_8$ may be formed first, followed by the formation of a metal-2 layer which can be patterned so as to provide metal-2 region 26. Also in this regard, note that contacts $28_1$ through $28_8$ are sometimes referred to as vias.

Figure 4:
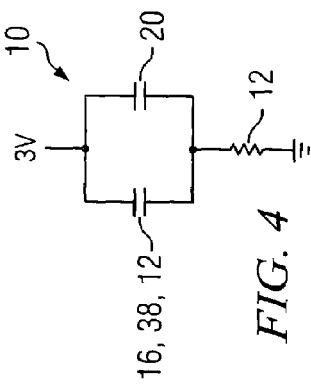
FIG. 4 illustrates a schematic of an approximate electrical equivalent of the stacked decoupling capacitor structure of FIGS. 1 through 3.

FIG. 4 illustrates a schematic of an approximation of the circuitry realized by structure 10, as will now be more apparent given the previous illustrations and discussion of the various components. In general, FIG. 4 demonstrates that there are two parallel capacitors. Looking to the first capacitor of FIG. 4, shown to the left in that figure, and with reference to FIG. 2, that first capacitor has one plate, namely doped polysilicon region 16, connected to 3 volts, as is achieved in an electrical path that passes through contact $24_2$ and metal-1 region $22_1$. The second plate of the first capacitor is provided by the N-type well 12; further, however, note from FIGS. 1 through 3 that well 12 extends a considerable horizontal distance, where that distance in the preferred embodiment is at least 25% of the dimension L spanned by the surface length of MIM capacitor 20. Thus, the distance spanned by N-type well 12 also provides a resistance, and the right end of that resistance is connected to ground, as shown in the schematic of FIG. 4 and also as achieved in FIGS. 2 and 3 through an electrical path that passes through active region $34_1$, silicide region $14_2$, contact $24_{12}$, and metal-1 region $22_3$. Looking now to the second capacitor of FIG. 4, shown to the right in that figure, and with reference to FIG. 2, that second capacitor is MIM capacitor 20. Further, MIM capacitor 20 has a first plate, namely layer $20_1$, that is connected to 3 volts through an electrical path that passes through contact $18_3$, doped polysilicion layer 16, contact $24_2$, and metal-1 region $22_1$. In other words, the positive voltage is applied to MIM capacitor 20 from its underside, that is, from the direction toward substrate 30. Additionally, MIM capacitor 20 has a second plate, namely layer $20_3$, separated from layer $20_1$ by a dielectric layer $20_2$, and that layer $20_3$ is connected through a resistor to ground. Specifically with reference to FIG. 3, layer $20_3$ is connected in an electrical path that passes through metal-1 region $22_4$, contacts $28_7$ and $28_8$, metal-2 region 26, contacts $28_3$ and $28_4$, metal-1 region $22_2$, contact $24_7$, silicide region $14_1$, and active region $34_2$ to the left end of N-type well 12. Again, the horizontal span of well 12 between its left and right ends provides a resistance between those ends that is connected to ground at its right end, through an electrical path that passes through active region $34_1$, silicide region $14_2$, and metal-1 region $22_3$.

From the above, one skilled in the art should appreciate that the preferred embodiments provide for a high capacitive density stacked decoupling capacitor structure that includes two capacitors in a vertically stacked configuration. In general, this stacked structure can be seen in FIGS. 2 and 3 such that each capacitor plate has a length along a same parallel plane (into the page) and such that the plates of the polysilicon-to-N-well capacitor are parallel to substrate 30 and the plates of MIM capacitor 20 are above and parallel to the plates of polysilicon-to-N-well capacitor. Further, from FIG. 4, one skilled in the art will appreciate that the two capacitors of structure 10 are essentially in parallel in an electrical sense, in which case the capacitance provided by each capacitor is added for a total overall capacitance. Note that the parallel connection is characterized as essentially parallel and the schematic of FIG. 4 is described above as an approximation because the actual resistance seen by each of the two capacitors will differ. Specifically, MIM capacitor 20 is connected to the full length of the N-type well 12 and thereby is connected to that full resistance, while the polysilcon-to-N-well capacitor formed below MIM capacitor 20 uses the N-type well 12 both as a capacitor plate and as a resistance to ground, thereby experiencing less resistance than provided to MIM capacitor 20. In any event, the electrical connection of the two capacitors may be approximated as a parallel connection. Thus, the first capacitor, which by itself is known in the art, may provide a capacitive density on the order of 5 fF/$\mu$m$^2$, yet that capacitance is added to the capacitive density of the MIM capacitor 20, which preferably is greater such as on the order of 10 fF/$\mu$m$^2$, thereby providing a total capacitive density on the order of 15 fF/$\mu$m$^2$. Moreover, this combined capacitance is achieved using the same amount of surface area as compared to that which would be used if only the polysilicon-to-n-well capacitor were implemented, that is, by stacking the two capacitors in a vertical fashion and thereby avoiding the consumption of additional lateral surface area. In addition, note that the resistance provided by the N-type well 12 serves a protective function for both capacitors. Specifically, should there be a failure of a capacitor dielectric (i.e., either gate insulator 38 or layer $20_2$), then there is an electrical short between the two associated capacitor plates. However, rather than that short-circuit connecting current directly to ground, the current is dissipated through the length of the resistance of well 12. As such, in the case of only a single or perhaps a few such failures on a single integrated circuit, the overall circuit still may be usable, albeit, without the decoupling capacitance that otherwise would be provided by the failed capacitor(s). To the contrary, were this resistive protection not provided, then a short-circuit directly to ground might render the entire integrated circuit unusable, thereby substantially reducing device yield in the case of mass fabrication of devices using such an approach. In addition, structure 10 provides these benefits with the additional benefit that it may be constructed with little alteration to the process flow used to construct transistors on the same integrated circuit. Indeed, as described above, only a single additional mask is required, that is, to pattern and etch the stack of layers $20_1$, $20_2$, and $20_3$, once those layers have been formed. However, note that rather than contacting layer $20_1$ from its underside (i.e., from the direction of substrate 30), in an alternative embodiment layer $20_1$ could be made to extend further laterally than layers $20_2$ and $20_3$, in which case layer $20_1$ could be contacted from the direction of the metal-2 layer, that is, from what is the top of structure 10 as shown in FIGS. 2 and 3; however, in such a case, two masks would be required, a first to etch layer $20_1$ to extend in this fashion, and a second to etch layers $20_2$ and $20_3$ back so that a portion of layer $20_1$ is exposed from the upper surface of structure 10. Nonetheless, this alternative also provides at least the benefits of greater capacitive density as well as the resistive fail-safe mechanism of the N-type well 12 in the event of a short circuit for either capacitor. Further, while certain preferred materials have been described, one skilled in the art may ascertain various alternatives that also may be implemented within the inventive teachings. Additionally, while the preceding embodiment has been shown as formed with a certain specified manufacturing process, various steps in that process may be altered and still fall within the inventive scope. Thus, the preceding benefits as well as the various alternative steps described and ascertainable by one skilled in the art demonstrate the flexibility of the inventive scope, and they should also demonstrate that while the present embodiments have been described in detail, various substitutions, modifications or alterations could be made to the descriptions set forth above without departing from the inventive scope which is defined by the following claims.

What is claimed is:

1. A capacitive structure, comprising:
a semiconductor base region having an upper surface;
a well formed within the semiconductor base region and adjacent the upper surface;
a first dielectric layer adjacent at least a portion of the upper surface;
a polysilicon layer adjacent the first dielectric layer, wherein the well, the first dielectric layer, and the first polysilicon layer form a first capacitor and are aligned along a planar dimension;
a first conductive layer positioned with at least a portion overlying at least a portion of the polysilicon layer and electrically connected to said polysilicon layer;
a second dielectric layer adjacent the first conductive layer;
a second conductive layer adjacent the second dielectric layer with a first electrical connection to said well, wherein the first conductive layer, the second dielectric layer, and the second conductive layer form a second capacitor and are aligned along the planar dimension; and
said first electrical connection further comprising:
a first metal layer comprising a first region and a second region electrically separate from the first region, wherein the first region is adjacent the second conductive layer;
a second metal layer at a distance greater than a distance between the upper surface and the first region of the first metal layer;
a second electrical connection between the first region of the first metal layer and the second metal layer;
a third electrical connection between the second metal layer and the second region of the first metal layer; and
a fourth electrical connection between the second region of the first metal layer and the well.

2. The capacitive structure of claim 1:
wherein the first conductive layer has a first side adjacent the second dielectric layer and a second side facing in a direction toward the upper surface; and
wherein the electrical connection contacts the second side of the first conductive layer.

3. The capacitive structure of claim 2 wherein the electrical connection is substantially perpendicular to the planar dimension.

4. The capacitive structure of claim 1:
wherein the well comprises a length having a first end and a second end;
wherein the second electrical connection is between the second conductive layer and the first end of the well; and
wherein the second end of the well is for connecting to a fixed potential.

5. The capacitive structure of claim 4 wherein the fixed potential is ground.

6. The capacitive structure of claim 4:
wherein the fixed potential equals a first fixed potential; and
wherein the first electrical connection is for connecting to a second fixed potential that is unequal to the first fixed potential.

7. The capacitive structure of claim 1:
wherein the second conductive layer has a first length in a first dimension along the planar dimension and a first width in a second dimension along the planar dimension that is perpendicular to the first length;
wherein the first region of the first metal layer has a second length, less than the first length, and in the first dimension; and
wherein the first region of the first metal layer has a second width, less than the first width, and in the second dimension.

8. The capacitive structure of claim 7 wherein the first conductive layer and the second conductive layer comprise TaN.

9. The capacitive structure of claim 7 wherein the second dielectric comprises $Ta_2O_5$.

10. The capacitive structure of claim 7:
wherein the first conductive layer and the second conductive layer comprise TaN; and
wherein the second dielectric comprises $Ta_2O_5$.

11. The capacitive structure of claim 7 wherein the second dielectric comprises a dielectric constant greater than 4.0.

12. The capacitive structure of claim 7 wherein the second capacitor has a capacitance greater than a capacitance of the second capacitor.

13. The capacitive structure of claim 1 wherein the semiconductor base region is selected from a set consisting of a semiconductor well and a semiconductor substrate.

14. The capacitive structure of claim 1:
wherein the second conductive layer has a first length in a first dimension along the planar dimension and a first width in a second dimension along the planar dimension that is perpendicular to the first length;
wherein the first region of the first metal layer has a second length, less than the first length, and in the first dimension; and
wherein the first region of the first metal layer has a second width, less than the first width, and in the second dimension.

15. The capacitive structure of claim 1 wherein the first conductive layer and the second conductive layer comprise TaN.

16. The capacitive structure of claim 1 wherein the second dielectric comprises $Ta_2O_5$.

17. The capacitive structure of claim 1:
wherein the first conductive layer and the second conductive layer comprise TaN; and
wherein the second dielectric comprises $Ta_2O_5$.

18. The capacitive structure of claim 1 wherein the second dielectric comprises a dielectric constant greater than 4.0.

19. The capacitive structure of claim 18 wherein the second capacitor has a capacitance greater than a capacitance of the second capacitor.

* * * * *